(12) United States Patent
Amano et al.

(10) Patent No.: US 10,192,300 B2
(45) Date of Patent: Jan. 29, 2019

(54) BOARD PRODUCTION WORK METHOD, BOARD IMAGING CONDITIONS DETERMINATION METHOD, AND BOARD PRODUCTION WORK DEVICE

(71) Applicant: FUJI CORPORATION, Chiryu (JP)

(72) Inventors: Masafumi Amano, Okazaki (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 184 days.

(21) Appl. No.: 14/913,081

(22) PCT Filed: Aug. 22, 2013

(86) PCT No.: PCT/JP2013/072435
§ 371 (c)(1),
(2) Date: Feb. 19, 2016

(87) PCT Pub. No.: WO2015/025403
PCT Pub. Date: Feb. 26, 2015

(65) Prior Publication Data
US 2016/0203592 A1  Jul. 14, 2016

(51) Int. Cl.
*G06T 7/00* (2017.01)
*G06K 9/46* (2006.01)
(Continued)

(52) U.S. Cl.
CPC .......... *G06T 7/0004* (2013.01); *G01B 11/002* (2013.01); *G06K 9/4661* (2013.01);
(Continued)

(58) Field of Classification Search
CPC ..................... G06T 7/0004; G01B 11/002
See application file for complete search history.

(56) References Cited

U.S. PATENT DOCUMENTS 6,047,084 A * 4/2000 Kent ............... H05K 13/08
                                                 348/126
6,246,788 B1 * 6/2001 Pattikonda ......... G01N 21/9501
                                                 257/E21.525
(Continued)

FOREIGN PATENT DOCUMENTS

JP    11-179288 A    7/1999
JP   2002-107125 A   4/2002
(Continued)

OTHER PUBLICATIONS

International Search Report dated Oct. 8, 2013 in PCT/JP2013/072435 filed Aug. 22, 2013.
(Continued)

*Primary Examiner* — Thai Q Tran
*Assistant Examiner* — Girumsew Wendmagegn
(74) *Attorney, Agent, or Firm* — Oblon, McClelland, Maier & Neustadt, L.L.P.

(57) ABSTRACT

A board production work method which includes a position detection process which detects an arrangement position of a detection target provided on a printed circuit board, and a work executing process which subjects the printed circuit board to predetermined production work based on the detected arrangement position, in which the position detection process includes an image acquisition step of imaging the printed circuit board under multiple imaging conditions and acquiring multiple items of original image data containing luminance values of each pixel arranged in two-dimensional coordinates, a difference calculation step of using two of the multiple items of original image data as calculation targets, calculating differences between luminance values of pixels with same coordinate values, and acquiring difference image data which is formed of luminance difference values of each of the pixels, and a position determination step of determining the arrangement position based on the difference image data.

11 Claims, 11 Drawing Sheets

(51) Int. Cl.
  *G06T 5/00* (2006.01)
  *H04N 5/225* (2006.01)
  *H04N 5/235* (2006.01)
  *G01B 11/00* (2006.01)

(52) U.S. Cl.
  CPC ............ *G06T 5/002* (2013.01); *G06T 7/0044* (2013.01); *H04N 5/2256* (2013.01); *H04N 5/2352* (2013.01); *G06T 2207/10016* (2013.01); *G06T 2207/30141* (2013.01); *G06T 2207/30152* (2013.01)

(56) References Cited

U.S. PATENT DOCUMENTS

| | | |
|---|---|---|
| 6,317,513 B2 | 11/2001 | Michael et al. |
| 6,768,812 B1 * | 7/2004 | Koljonen ........... G01N 21/8806 382/150 |
| 2001/0055409 A1 | 12/2001 | Shiratsuchi et al. |
| 2006/0018540 A1 | 1/2006 | Imamura et al. |
| 2009/0064489 A1 | 3/2009 | Inoue et al. |
| 2010/0208944 A1 * | 8/2010 | Fukunishi ................ G06T 5/50 382/107 |

FOREIGN PATENT DOCUMENTS

| | | |
|---|---|---|
| JP | 2006-30106 A | 2/2006 |
| JP | 2007 287779 A | 11/2007 |
| JP | 2012-124399 A | 6/2012 |

OTHER PUBLICATIONS

European Office Action for European Patent Application No. 13 891 989.9, dated Aug. 13, 2018.

* cited by examiner

BOARD PRODUCTION WORK METHOD, BOARD IMAGING CONDITIONS DETERMINATION METHOD, AND BOARD PRODUCTION WORK DEVICE

TECHNICAL FIELD

The present disclosure relates to a work method of producing a printed circuit board on which multiple components are mounted, a method of determining imaging conditions when imaging a printed circuit board during production, and a work device which produces a printed circuit board. More specifically, the present disclosure relates to a method and a device which image a printed circuit board, subject acquired original image data to image processing, detect an arrangement position of a detection target such as solder paste, and perform predetermined production work on the printed circuit board based on the detected arrangement position.

BACKGROUND ART

As devices which produce printed circuit boards on which multiple components are mounted, there are solder printers, component mounting machines, reflow ovens, printed circuit board testers, and the like, and these are often linked to form a printed circuit board production line. Of these devices, component mounting machines are generally provided with a board conveyance device, a component supply device, and a component transfer device. The board conveyance device performs the loading, unloading, and positioning of the printed circuit board. The component supply device sequentially supplies components of multiple types to a predetermined supply position. The component transfer device is provided with a board camera which images a positioned printed circuit board, a suction nozzle which picks up and holds a component from the component supply device using negative pressure and mounts the component to the printed circuit board, and a head drive section which drives a mounting head which holds the board camera and the suction nozzle.

In order to mount a component at a predetermined mounting point on a printed circuit board, generally, fiducial marks on the positioned printed circuit board are imaged and the positioning error is corrected in advance. Accordingly, it is possible to accurately perform positional control of the suction nozzle to the mounting point using coordinate values on the printed circuit board. However, in a solder printer, when printing solder paste on a land (a part of a circuit pattern onto which leads of a component are soldered) corresponding to the mounting point, the printing may shift for some reason and the solder position may deviate from the center of the land. In this case, when performing positional control based on the coordinate values, if the actual mounting point of the component is the center of the land, the mounting point deviates from the center of the solder position. Therefore, an adverse effect arises in that the component is pushed out from the center of the land, which is the original mounting point, and falls over and so on by the solder, which is remelted in the reflow oven, flowing to the center of the land.

A technique of TOP (Target On Paste) mounting has been developed in order to prevent the adverse effect caused by the print shifting of the solder paste described above. In TOP mounting, the solder position at which the solder paste is actually printed is detected, and mounting is performed after correcting the coordinate values of the mounting point of the component accordingly. Therefore, a self alignment effect is obtained in the reflow oven. In other words, the component which is mounted at the center of the solder position is automatically subjected to positional correction to the vicinity of the center of the land, which is the original mounting point, by the flowing of the remelted solder. Examples of techniques which enable the detection of the printed solder position by image processing in order to perform the TOP mounting are disclosed in PTL 1 and PTL 2.

A three-dimensional measurement device of PTL 1 is provided with means for irradiating a measurement target with a striped light intensity light pattern containing multiple wavelength components, a means for separating the reflected light from the measurement target for each wavelength component, imaging the separated result, and acquiring the image data, a means for changing a relative phase relationship between the measurement target and the light pattern, and a means for calculating the height of the measurement target based on multiple items of image data under multiple relative phase relationships. Accordingly, it is considered possible to greatly improve the measurement precision with regard to the calculated height. Note that, the embodiment discloses a mode in which solder paste which is formed by printing on a printed circuit board is subjected to three-dimensional measurement and quality determination is performed.

A screen printer of PTL 2 is provided with a monochrome imaging means for imaging an inspection target region on a printed circuit board, onto which solder has been transferred, from vertically above, a first lighting means for irradiating the inspection target region from vertically above, a second lighting means for irradiating the inspection target region from diagonally above, a means for obtaining a first image in which a land appears due to the first lighting means and obtaining a second image in which the land and solder appear due to the second lighting means, and a means for obtaining an image in which the first image is subtracted from the second image to depict the solder. Accordingly, it is considered possible to obtain an image in which only the solder is depicted using a low cost monochrome camera.

CITATION LIST

Patent Literature

PTL 1: JP-A-2002-107125
PTL 2: JP-A-2012-124399

BRIEF SUMMARY

Problem To Be Solved

However, in the three-dimensional measurement device of PTL 1, it is necessary to variably control the distance between the camera and the measurement target using the means for changing the relative phase relationship, and the configuration is complex and extremely expensive. Therefore, it was not possible to use the technique of PTL 1 using a low cost fixed-distance type monochrome board camera which is generally equipped on component mounting machines. Additionally, since it is possible to obtain clear and stable image data even with a monochrome camera if fiducial marks which are prepared in advance for image processing are present, it is possible to precisely detect the position even without performing three-dimensional image processing. However, since the solder paste is not printed with image processing in mind, it is difficult to obtain clear and stable image data using a monochrome camera, making it difficult to precisely detect the solder position using image processing.

Since the technique of PTL 2 uses a low cost monochrome camera, it is preferable in that it is possible to apply this to a general component mounting machine. However, in reality, it is extremely difficult to distinguish the land from the solder using only differences in the lighting direction. In actuality, an operator repeatedly changes each of the imaging conditions, including the lighting direction, and expends great effort in searching for image data in which it is possible to accurately detect the solder position using the board camera of the component mounting machine. Moreover, favorable imaging conditions under which it is possible to obtain clear and stable image data while distinguishing the solder paste from other portions may not exist.

Ordinarily, for subsequent maintenance, the printed circuit board is subjected to silkscreen printing of symbols representing component codes and the like, a bar-code for identifying the printed circuit board, and the like. Such silkscreen printing is printed in a color with a high luminance value which contrasts the substrate color of the printed circuit board, and there are many cases in which the luminance value of the printed result is similar to those of the land and the solder. Therefore, with the technique of PTL 2, it is not possible to solve a concern that the silkscreen printing will be confused with the land or the solder. Therefore, in order to perform TOP mounting using a component mounting machine, a technique capable of precisely detecting the solder position using a monochrome camera is necessary.

Note that, in the production work of a printed circuit board, the detection target of the position detection carried out by image processing is not limited to solder paste, and the camera which is used is not limited to a monochrome camera. In other words, in addition to the solder paste, a mounted component, silkscreen printed symbols such as characters and bar-codes, and various markers such as fiducial marks can be considered as the detection target. The original image data which serves as the source of the image processing may be acquired using a color camera.

The present disclosure was made in light of the problems of the background art described above, and aims to solve the problem of providing a board production work method for precisely detecting an arrangement position of a detection target on a printed circuit board using image processing while using a simple device configuration, a board imaging conditions determination method to use during the board production work, and a board production work device which precisely detects the arrangement position of the detection target on the printed circuit board.

Solution to Problem

A board production work method according to an embodiment which solves the problems described above includes a position detection process of detecting an arrangement position of a detection target provided on a printed circuit board, and a work executing process of subjecting the printed circuit board to predetermined production work based on the detected arrangement position, in which the position detection process includes an image acquisition step of imaging the printed circuit board under multiple imaging conditions and acquiring multiple items of original image data containing luminance values of each pixel arranged in two-dimensional coordinates, a difference calculation step of using two of the multiple items of original image data as calculation targets, calculating differences between luminance values of pixels with same coordinate values, and acquiring difference image data which is formed of luminance difference values of each of the pixels, and a position determination step of determining the arrangement position based on the difference image data.

Accordingly, the differences between the luminance values of the multiple items of original image data which are acquired by imaging the printed circuit board under multiple imaging conditions are calculated and used as the difference image data. Here, luminance values of each of the pixels do not change uniformly when the imaging conditions are changed, in other words, the difference in luminance values (the luminance difference) changes depending on the object in the visual field of each pixel. For example, there is a first case in which the luminance difference values at the arrangement position of the detection target are great and the luminance difference values at positions other than the arrangement position are small. Conversely, there is a second case in which the luminance difference values at the arrangement position are small and the luminance difference values at the other positions are great. Furthermore, there is a third case in which the luminance difference values are approximately the same at both the arrangement position and the other positions. Therefore, by setting the multiple favorable imaging conditions under which the first case or the second case are prominently generated, it is possible to set the arrangement position of the detection target on the printed circuit board based on the difference in magnitude of the luminance difference values of the difference image data.

It is possible to determine, as appropriate, the specific multiple imaging conditions with reference to the imaging conditions which were favorable for a previous printed circuit board which already has a production record and in which the substrate color of the printed circuit board, the material of the detection target, and the like are similar, and it is also possible to determine using the board imaging conditions determination method disclosed in claim 11. Accordingly, even when another object having the same degree of luminance value as the detection target is hypothetically present in another position and it is not possible to distinguish the detection target from the other object in the individual items of original image data, it is possible to precisely detect the arrangement position of the detection target on the printed circuit board based on the difference image data. This is because the first case or the second case arises prominently in the difference image data, and the luminance difference values of the detection target at the arrangement position differ greatly from the luminance difference values of the other object in the other position.

It is possible to detect the arrangement position of the detection target even if a simple, low cost, monochrome camera is used. Therefore, this is favorably applicable for use in performing TOP mounting using a component mounting machine, and it is not necessary to greatly modify the device configuration of the component mounting machine.

A board imaging conditions determination method according to an embodiment is a board imaging conditions determination method in an imaging condition determination process, the method including an imaging condition determination process which determines, in advance, multiple imaging conditions under which to image a detection target provided on a printed circuit board, a position detection process which detects an arrangement position of the detection target based on multiple items of original image data which are acquired by imaging the printed circuit board under the multiple imaging conditions, a work executing process which subjects the printed circuit board to predetermined production work based on the detected arrangement position, a test image acquisition step of imaging a sample printed circuit board on which the detection target is provided and for which the arrangement position is known under various imaging conditions, and acquiring various test image data containing a luminance value of each pixel arranged in two-dimensional coordinates, a test difference calculation step of using multiple combinations in which two items of the various test image data are combined as calculation targets, calculating differences or absolute values of differences between luminance values of pixels having the same coordinate values in each of the combinations, and acquiring multiple items of test difference image data formed of luminance difference values of each of the pixels, and a test determination step of determining suitability of each of the multiple items of test difference image data based on the known arrangement position, and determining imaging conditions of two items of test image data upon which the test difference image data which is determined to be suitable is based as the multiple imaging conditions of the position detection process.

Accordingly, in the imaging condition determination process, for the multiple combinations in which two items of the various test image data which are acquired by imaging the sample printed circuit board under various imaging conditions are combined, each item of the test difference image data is acquired through calculation, the suitability is determined, and the multiple imaging conditions are determined from the test difference image data which is determined to be suitable. Therefore, since the suitable combinations are selected by testing the image processing on all conceivable combinations of imaging conditions without relying on only experience and intuition, it is possible to reliably determine multiple favorable imaging conditions.

DESCRIPTION OF EMBODIMENTS

Figure 1:
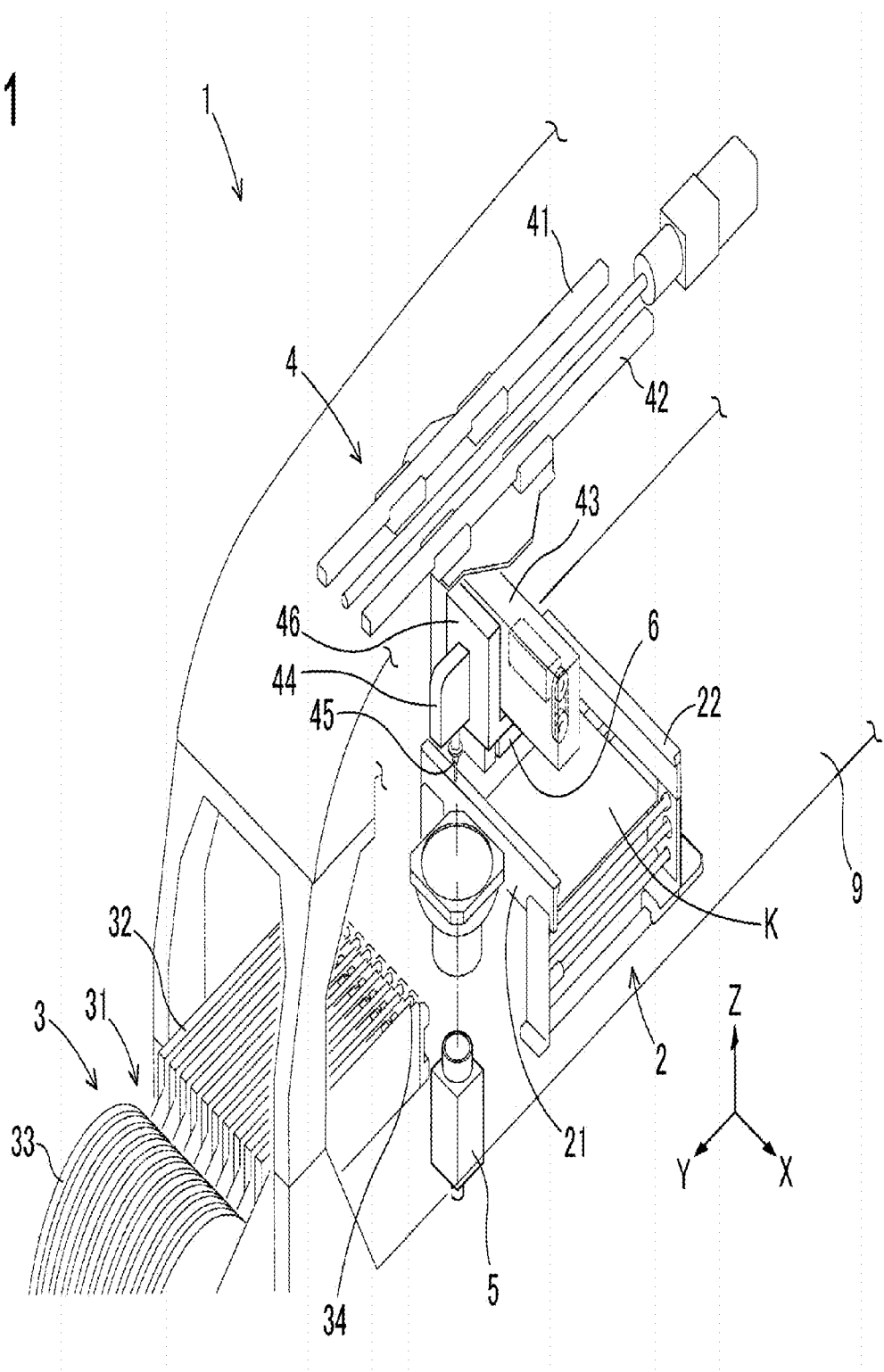
FIG. 1 is a perspective diagram illustrating the overall configuration of a component mounting machine which uses a board production work method of a first embodiment.

Description will be given of the board production work method of the first embodiment of the present disclosure with reference to FIGS. 1 to 11. First, description will be given of the overall configuration of component mounting machine 1 which uses the board production work method of the first embodiment with reference to FIG. 1. Component mounting machine 1 is formed by board conveyance device 2, component supply device 3, component transfer device 4, and component camera 5 which are assembled onto device table 9. Each of the devices 2 to 5 is controlled by a control computer which is omitted from the drawings, and each performs predetermined production work.

Board conveyance device 2 conveys a printed circuit board K to a mounting position, positions the printed circuit board K and unloads the printed circuit board. Board conveyance device 2 is formed of first and second guide rails 21 and 22, a pair of conveyor belts, a clamp device, and the like. The first and second guide rails 21 and 22 span the center of the top portion of the device table 9 extending in the conveyance direction (X-axis direction) and are assembled onto device table 9 so as to be parallel to each other. The pair of conveyor belts (omitted from the drawings) is provided on the inside of the first and second guide rails 21 and 22 such that the conveyor belts are disposed parallel to each other. The conveyor belts rotate with printed circuit board K placed on the conveyor conveyance surface, and perform the loading and unloading of printed circuit board K to the mounting position which is set in the center portion of device table 9.

A clamp device (omitted from the drawings) is provided below the conveyor belt at the mounting position. The clamp device pushes up printed circuit board K, clamps printed circuit board K in a horizontal orientation, and positions printed circuit board K in the mounting position. Accordingly, the component transfer device 4 can perform component mounting operation at the mounting position.

Component supply device 3 supplies multiple types of components. Component supply device 3 is a feeder type device and is provided on the front portion (the front-left side of FIG. 1) of component mounting machine 1 in a longitudinal direction. Component supply device 3 includes multiple cassette feeders 31 which are attachable and detachable. Cassette feeder 31 is provided with main body 32, supply reel 33 which is provided on a rear portion of main body 32, and component removal section 34 which is provided on the distal end of main body 32. Long and narrow tape (omitted from the drawings) in which multiple components are stored at a predetermined pitch is wound and held in supply reel 33; the tape is pulled out at a predetermined pitch by a sprocket (omitted from the drawings), the components are released from the stored state and are sequentially conveyed to component removal section 34.

Component transfer device 4 picks up a component from component removal section 34 of component supply device 3, conveys the component to the positioned printed circuit board K and mounts the component thereon. Component transfer device 4 is an XY robot type of device capable of horizontal movement in an X-axis direction and a Y-axis direction. Component transfer device 4 is formed of a pair of Y-axis rails 41 and 42, Y-axis slider 43, X-axis slider 46, mounting head 44, suction nozzle 45, board camera 6, and the like.

The pair of Y-axis rails 41 and 42 is arranged from a rear portion (the far-right side of FIG. 1) of device table 9 in a longitudinal direction to above the component supply device 3 at the front portion of device table 9. Y-axis slider 43 bridges across Y-axis rails 41 and 42 and is capable of moving in a Y-axis direction. On Y-axis slider 43, X-axis slider 46 is bridged to be capable of moving in an X-axis direction. Mounting head 44 is fixed on the front side of X-axis slider 46. Suction nozzle 45 is held on a lower side of mounting head 44 in an exchangeable manner. Mounting head 44 is driven in the two horizontal directions (the X and Y directions) by two servo motors. A head drive section is formed of two servo motors, Y-axis rails 41 and 42, Y-axis slider 43, X-axis slider 46, and the like. Board camera 6 which images printed circuit board K is provided on the bottom surface of X-axis slider 46 to face downward (described later in detail).

Component camera 5 is provided facing upward on the top surface of device table 9 between board conveyance device 2 and component supply device 3. Component camera 5 images and detects the state of the component which has been picked up as heads 45 to 47 move above from the component supply device 3 to above printed circuit board K. When component camera 5 detects an error in the held position of the component, shifting of the rotational angle of the component, or the like, the component mounting operation is subjected to minute adjustments as necessary, and components for which mounting is problematic are discarded.

FIGS. 2 to 5 are side views illustrating board camera 6 and printed circuit board K. Board camera 6 is controlled to be positioned above the positioned printed circuit board K. Board camera 6 images from above the printed circuit board K on which solder paste P, which is the detection target, is printed. Board camera 6 is formed of imaging section 61, vertical emission light source 62, oblique emission light source 63, and the like which share a center axial line extending in the up-down directions. Imaging section 61 includes multiple monochrome imaging elements (pixels) which are two-dimensionally arranged, performs an imaging operation, and acquires original image data containing shading luminance values of each pixel. For example, a luminance value can be expressed by a digital value of digits (gradation) of 0 to 255 represented by 8 bits; here, the larger the numerical value, the brighter the high luminance (white), and the smaller the numerical value, the darker the low luminance (black). The number of digits (the number of gradations) may be refined by increasing the number of bits used. The embodiment is not limited to monochrome imaging elements, and a color camera having imaging elements (pixels) with three primary colors may be used. Imaging section 61 is controlled such that the exposure time condition (the shutter speed) during the imaging is incrementally variable.

Vertical emission light source 62 emits a light beam along the center axial line approximately straight downward. Oblique emission light source 63 is arranged in a ring shape around the periphery of vertical emission light source 62 and emits the light beam toward a direction approaching the center axial line approximately diagonally downward. Vertical emission light source 62 and oblique emission light source 63 are controlled to switch between red light and blue light as the light source color during the imaging. Vertical emission light source 62 and oblique emission light source 63 are individually controlled to switch on/off such that it is possible to change the emission direction conditions during the imaging.

Component mounting machine 1 is provided with a control computer which is omitted from the drawings. The control computer holds design information such as the relationship between the type of the printed circuit board to be produced and the types of the component to be mounted, and the coordinate values of the mounting points on printed circuit board K onto which the components are to be mounted. The control computer controls component mounting operation based on image data which is imaged by board camera 6 and component camera 5, detection information of sensors which are omitted from the drawings, and the like.

The control computer controls the imaging conditions of board camera 6. Specifically, when the control computer incrementally controls the exposure time condition of imaging section 61, the brightness of the obtained original image data changes according to the length of the exposure time. The control computer controls the switching of the light source colors of vertical emission light source 62 and oblique emission light source 63, and individually controls vertical emission light source 62 and oblique emission light source 63 to turn on/off. The control computer receives multiple items of original image data which are acquired by board camera 6 performing the imaging operation in multiple imaging conditions. The control computer controls the execution of the board production work method of the first embodiment in order to perform TOP (Target On Paste) mounting.

Figure 2:
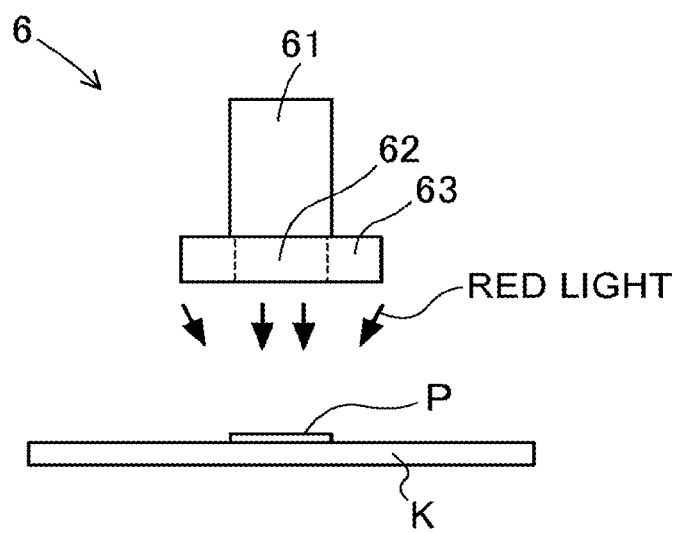
FIG. 2 is a side view illustrating a board camera together with a printed circuit board, and shows a state in which a vertical emission light source and an oblique emission light source are both controlled to emit red light.
Figure 3:
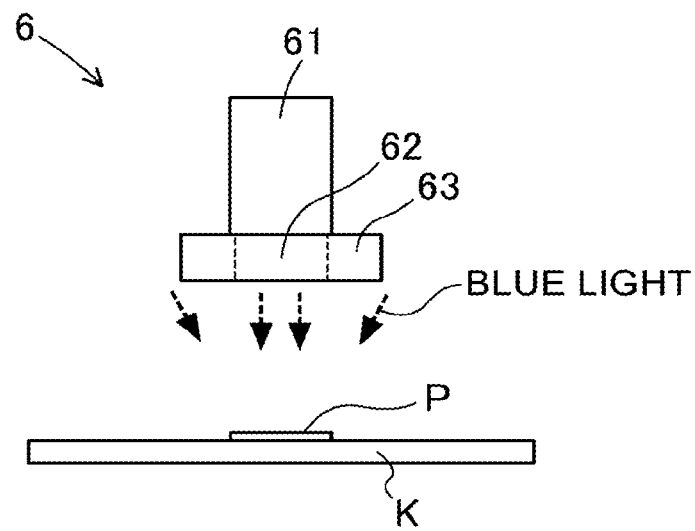
FIG. 3 is a side view as described above, and shows a state in which the vertical emission light source and the oblique emission light source are both controlled to emit blue light.
Figure 4:
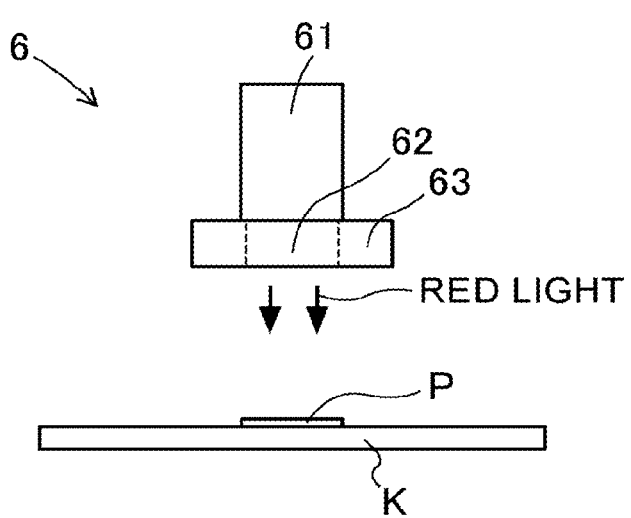
FIG. 4 is a side view as described above, and shows a state in which the vertical emission light source is controlled to emit red light and the oblique emission light source is controlled to be off.
Figure 5:
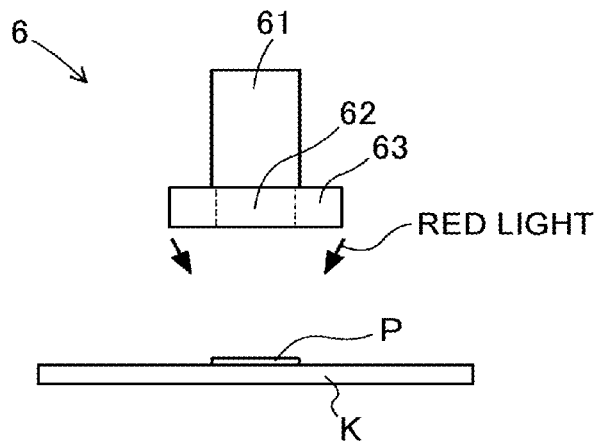
FIG. 5 is a side view as described above, and shows a state in which the vertical emission light source is controlled to be off and the oblique emission light source is controlled to emit red light.

FIG. 2 shows a state in which vertical emission light source 62 and oblique emission light source 63 are both controlled to emit red light (solid line arrows in the drawing). FIG. 3 shows a state in which vertical emission light source 62 and oblique emission light source 63 are both controlled to emit blue light (dashed line arrows in the drawing). FIG. 4 shows a state in which vertical emission light source 62 is controlled to emit red light (solid line arrows in the drawing) and oblique emission light source 63 is controlled to be off. Conversely, FIG. 5 shows a state in which vertical emission light source 62 is controlled to be off and oblique emission light source 63 is controlled to emit red light (solid line arrows in the drawing). The states of FIGS. 4 and 5 can also be switched to blue light.

Therefore, the light source color conditions during the imaging are the two conditions of red light and blue light. The emission direction conditions during the imaging are the three conditions of only vertical emission light source 62 on, only oblique emission light source 63 on, and both vertical emission light source 62 and oblique emission light source 63 on. Note that, the light sources for board camera 6 lighting are not limited to those described above. For example, one or multiple of red light, blue light, and yellow light sources may be controlled to be on, or each of three light sources may be controlled to be on/off individually. For each combination of light source color conditions and emission direction conditions, the exposure time of imaging section 61 is controlled incrementally, such that various imaging conditions are set.

Next, description will be given of the board production work method of the first embodiment according to the work process diagram of FIG. 6. The board production work method of the first embodiment is formed of imaging condition setting step S10, solder position detection process S2, and component mounting process S3. Solder position detection process S2 uses solder paste P which is printed on printed circuit board K as the detection target, and uses the solder position in which solder paste P is present as the arrangement position to be detected. Solder position detection process S2 includes, in execution order, first image acquisition step S21, second image acquisition step S22, difference calculation step S23, and position determination step S24.

Figure 6:
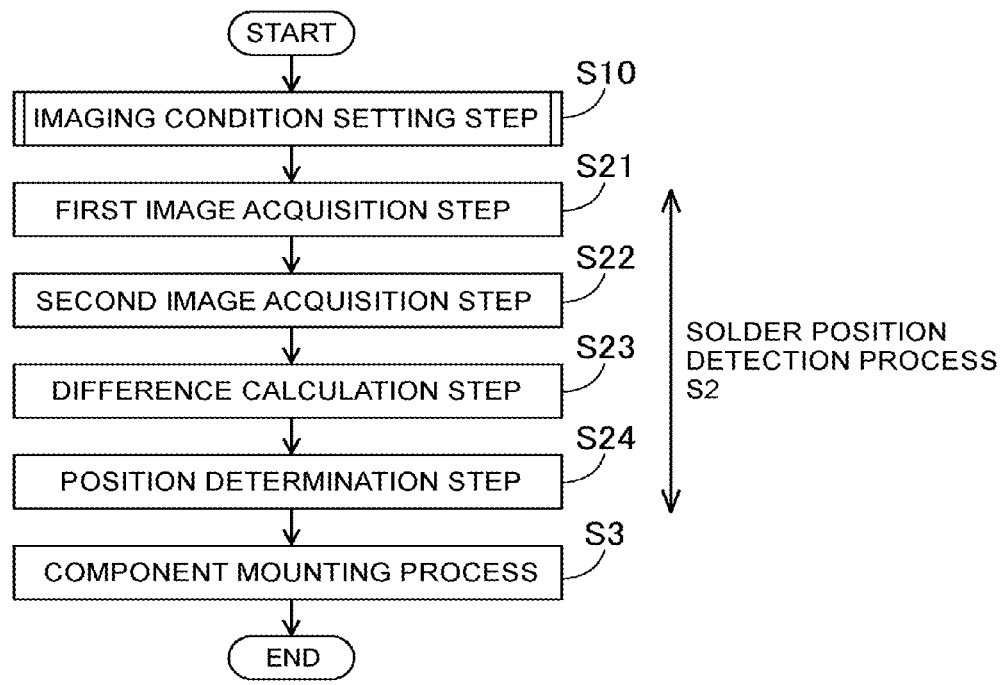
FIG. 6 is a work process diagram describing the board production work method of the first embodiment.

In imaging condition setting step S10 of the work process diagram of FIG. 6, an operator sets the first imaging conditions and the second imaging conditions when imaging printed circuit board K using board camera 6 in the control computer. The first and second imaging conditions are set in order to distinguish the solder positions in which solder paste P is printed from the other positions. Therefore, when comparing the first original image data and the second original image data which are acquired under corresponding imaging conditions, it is preferable that under the imaging conditions, the change amount of the luminance differs greatly between the solder positions and the other positions. In other words, it is preferable that either the luminance change amount at the solder position is great and the luminance change amount at the other positions is small, or that the luminance change amount at the solder position is small and the luminance change amount at the other positions is great.

However, since whether the change amount of the luminance greatly differs between the solder position and the other positions depends on the substrate color of the printed circuit board, the model number and temperature of solder paste P, and the like, it is not possible to easily determine a favorable set of the first imaging conditions and the second imaging conditions. Therefore, the operator determines the set of the first imaging conditions and the second imaging conditions, as appropriate, with reference to the imaging conditions which were favorable for a previous printed circuit board which already has a production record and in which the substrate color of the printed circuit board, the model number of solder paste P, and the like are similar. Alternatively, the operator performs imaging condition determination process S1 of the third embodiment which is described later to determine the set of the first imaging conditions and the second imaging conditions.

Next, the operator instructs the control computer to perform solder position detection process S2 and component mounting process S3. Thereafter, the control computer automatically performs each of the processes S2 (S21 to S24) and S3. In first image acquisition step S21 of solder position detection process S2, the control computer controls board camera 6 to assume the first imaging conditions, causes board camera 6 to perform the imaging operation, and acquires first original image data Bd1. Next, in second image acquisition step S22, the control computer controls board camera 6 to assume the second imaging conditions, causes board camera 6 to perform the imaging operation, and acquires second original image data Bd2.

Next, in difference calculation step S23, the control computer uses first original image data Bd1 and second original image data Bd2 as calculation targets, calculates the differences between the luminance values of the pixels of the same coordinate values, and acquires difference image data Dd which is formed of the luminance difference values of each of the pixels. At this time, the luminance difference values are set to positive values by subtracting the original image data having relatively low (dark) luminance values from the original image data having relatively high (bright) luminance values. Even so, when the luminance difference values become negative values in a portion of the pixels, the luminance difference values of these pixels are treated as zero. The reason that the luminance difference values are not set to negative values is to not generate errors when displaying the difference image data Dd, and to render case-by-case calculation processing unnecessary.

Next, in position determination step S24, the control computer determines the solder position in which solder paste P is present based on the difference image data Dd. At this time, since the luminance difference value differs greatly between the solder position and the other positions in the difference image data Dd, it is possible to easily determine the solder position. Specifically, it is possible to determine the solder position based on the change amount or the change rate by which the luminance difference value of each of the pixels changes according to the change in the coordinate values in the difference image data Dd, or, based on a magnitude relationship between the luminance difference value of each pixel of the difference image data Dd and a predetermined threshold.

For example, when the luminance difference value of the solder position is 100 and the luminance change amount of the other positions is 40, it is possible to determine a region boundary line of the solder position as the luminance difference value of each pixel is reduced from 100 to 40 according to the change in the coordinate values based on the change amount or the change rate. Alternatively, it is possible to set, for example, a luminance difference value of 70 as a predetermined threshold between the luminance difference value of 100 of the solder position and the luminance difference value of 40 of the other positions, and to determine a region formed of pixels having a luminance difference value of greater than or equal to 70 to be the solder position. Note that, the determination of the solder position in solder position detection process S2 is preferably performed at several separated locations on the printed circuit board K.

Next, the control computer corrects the coordinate values of the mounting point of the component at the start of component mounting process S3. The correction is performed when the actual solder position which is detected in solder position detection process S2 deviates from the design information of the coordinate values of the mounting point which is stored in advance by the control computer. The control computer compensates for the deviation amount of the actual solder position and it is possible to mount the component in the center of the solder position.

Here, when the printing of solder paste P in a solder printer on the upstream side of the component mounting machine 1 is shifted, there are many cases in which the shifting is caused by parallel movement. In these cases, the deviation amount of the solder positions at several locations on printed circuit board K which is subjected to solder position detection process S2 is approximately the same. Therefore, it is possible to correct the coordinate values of the mounting points of all of the components in the same manner. When the shifting of the printing of solder paste P is rotationally dependent, the deviation amount of the solder position differs at several locations on printed circuit board K which is subjected to solder position detection process S2. In this case, the center of rotation and the rotation angle of the shifting of the printing is obtained by calculation, and a different correction is performed for each component. Alternatively, the coordinate values of the mounting point are corrected by interpolation for each component based on the deviation amounts of several measured locations. Subsequently, the control computer performs the TOP mounting, in other words, the control computer mounts the component on approximately the center of solder paste P based on the post-correction coordinate values of the mounting point.

Figure 7:
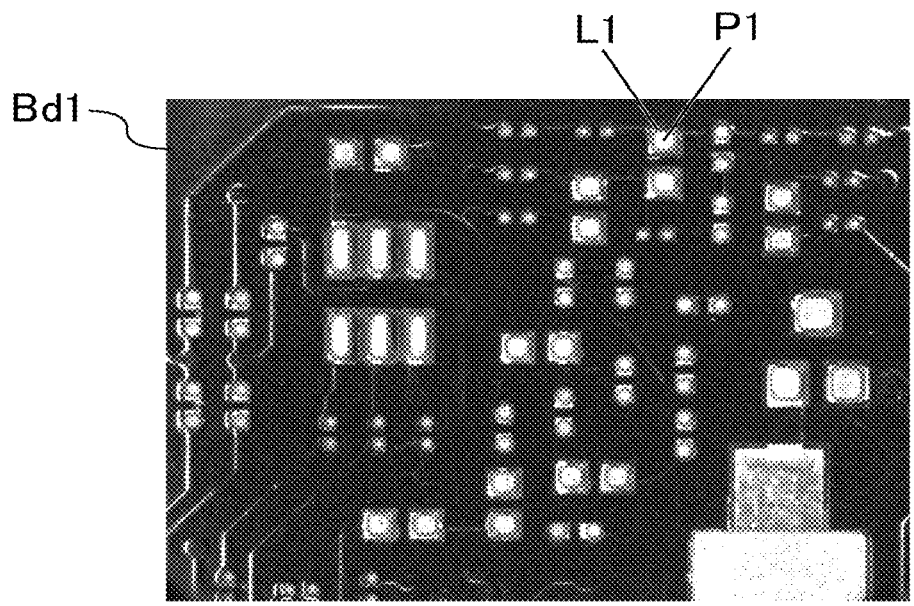
FIG. 7 is a diagram showing first original image data of a printed circuit board on which solder paste has been printed onto lands when imaged under first imaging conditions.
Figure 8:
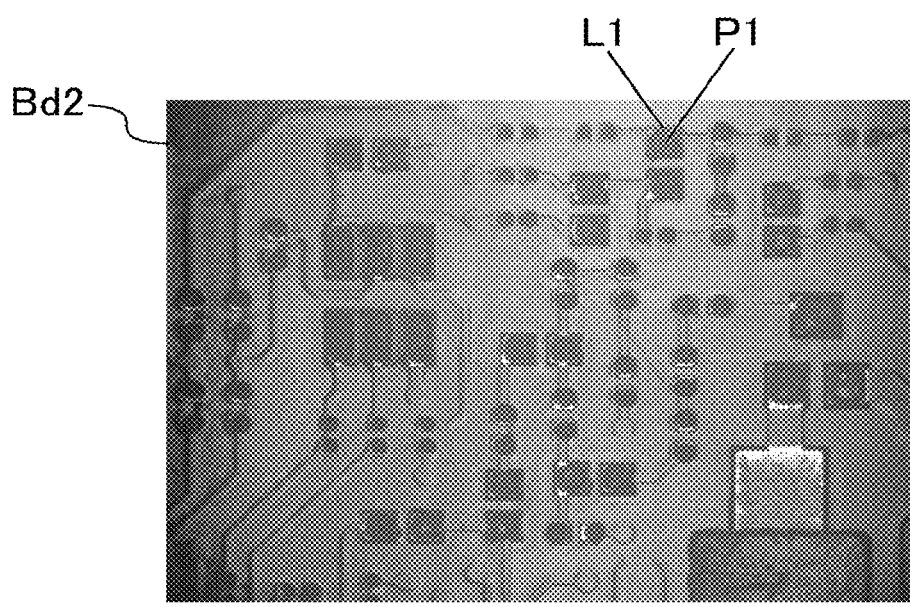
FIG. 8 is a diagram showing second original image data of the same printed circuit board as in FIG. 7 when imaged under second imaging conditions.
Figure 9:
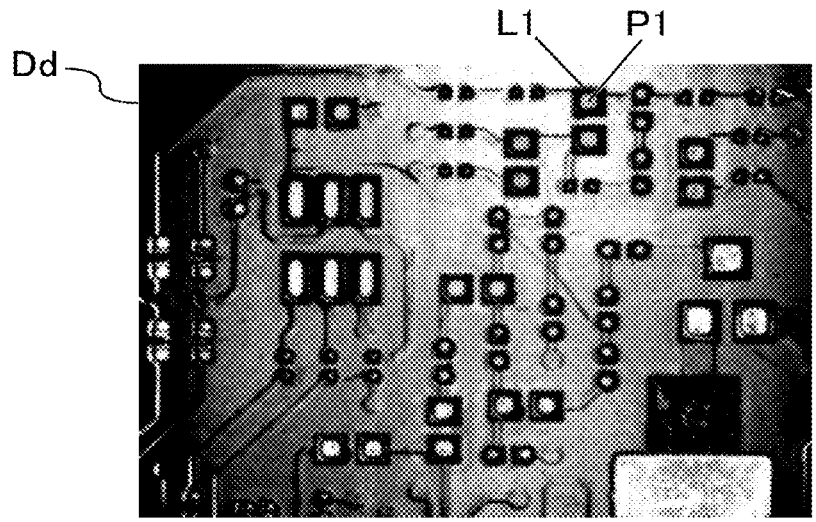
FIG. 9 is a diagram showing difference image data formed of luminance difference values of each pixel acquired by subtracting the second original image data of FIG. 8 from the first original image data of FIG. 7.

Next, description is given of an example of the operations of the board production work method of the first embodiment described above. FIG. 7 is a diagram showing first original image data Bd1 of printed circuit board K1 on which solder paste P1 has been printed onto a land L1 when imaged under the first imaging conditions. FIG. 8 is a diagram showing second original image data Bd2 of the same printed circuit board K1 as in FIG. 7 when imaged under the second imaging conditions. FIG. 9 is a diagram showing difference image data Dd formed of luminance difference values of each pixel acquired by subtracting second original image data Bd2 of FIG. 8 from first original image data Bd1 of FIG. 7.

The printed circuit board K1 has a dense grey substrate color, and a circuit pattern is formed thereon. A portion of the circuit pattern forms land L1, and solder paste P1 is printed onto land L1. For the first imaging conditions under which printed circuit board K1 is imaged, the exposure time of board camera 6 is 40 ms, and for the light source color condition and the emission direction condition, vertical emission light source 62 is controlled to be off, and oblique emission light source 63 is controlled to emit blue light. In first original image data Bd1 of FIG. 7 captured with the first imaging conditions, land L1, which is slightly to the right in the top portion of the image, is actually substantially rectangular shaped. Solder paste P1 which is printed on approximately the center of land L1 is actually substantially circular shaped. In the first original image data Bd1, land L1 and solder paste P1 both have luminance values which are higher than that of the substrate of the printed circuit board K and appear bright. In land L1, irregularities arise in the luminance values, and in a portion of land L1, the luminance values are higher and approach the luminance values of solder paste P1. Therefore, in the first original image data Bd1, it is not possible to accurately distinguish land L1 from solder paste P1.

For the second imaging conditions, the exposure time of board camera 6 is 35 ms, and for the light source color condition and the emission direction condition, vertical emission light source 62 is controlled to emit red light, and oblique emission light source 63 is controlled to be off. In second original image data Bd2 of FIG. 8 captured with the second imaging conditions, land L1 and solder paste P1, which are in the same positions as in the first original image data Bd1, have luminance values which are lower than the substrate of the printed circuit board K and appear dark. Some irregularities arise in the luminance values of land L1 and the luminance values of a portion of the land L1 are approaching the luminance values of solder paste P1. Therefore, in second original image data Bd2, it is not possible to accurately distinguish land L1 from solder paste P1.

In contrast, in difference image data Dd of FIG. 9, the situation is different. In other words, land L1 of the same position as in the first and second original image data Bd1 and Bd2 has luminance difference values which are lower than those of the substrate of the printed circuit board K and appears dark, and there is very little irregularity in the luminance difference values. The luminance difference values of solder paste P1 of approximately the center of land L1 are clearly higher than the luminance difference values of the periphery of land L1. Therefore, based on difference image data Dd, it is possible to precisely detect the solder position of solder paste P1 which is printed on land L1.

Figure 10:
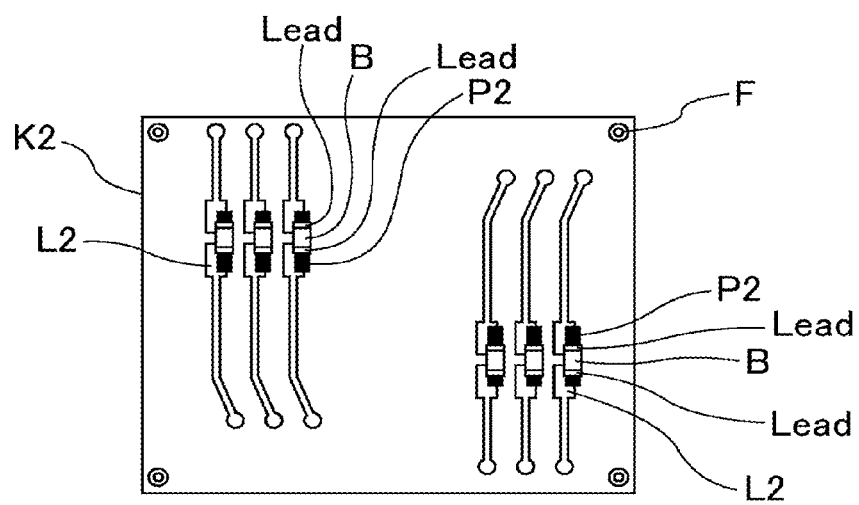
FIG. 10 is a plan view schematically illustrating a state in which components are mounted on solder paste on a printed circuit board in a component mounting process of the first embodiment.
Figure 11:
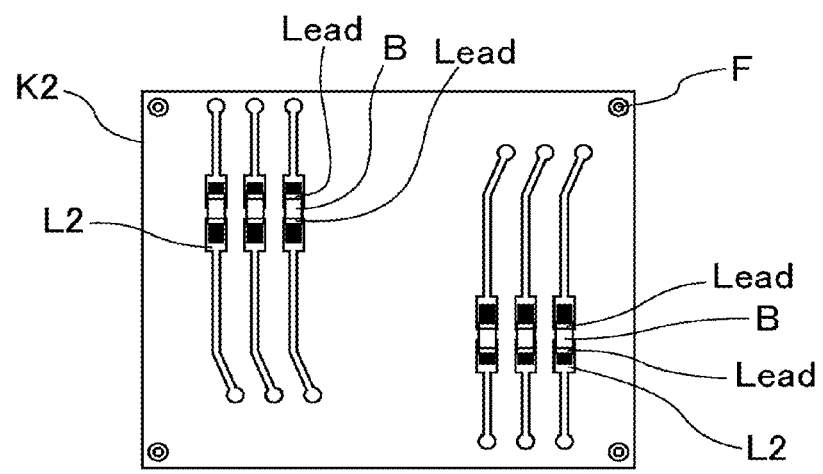
FIG. 11 is a plan view schematically illustrating a state in which, after the component mounting process of FIG. 10, the solder paste on the printed circuit board is remelted in a reflow oven.
Figure 12:
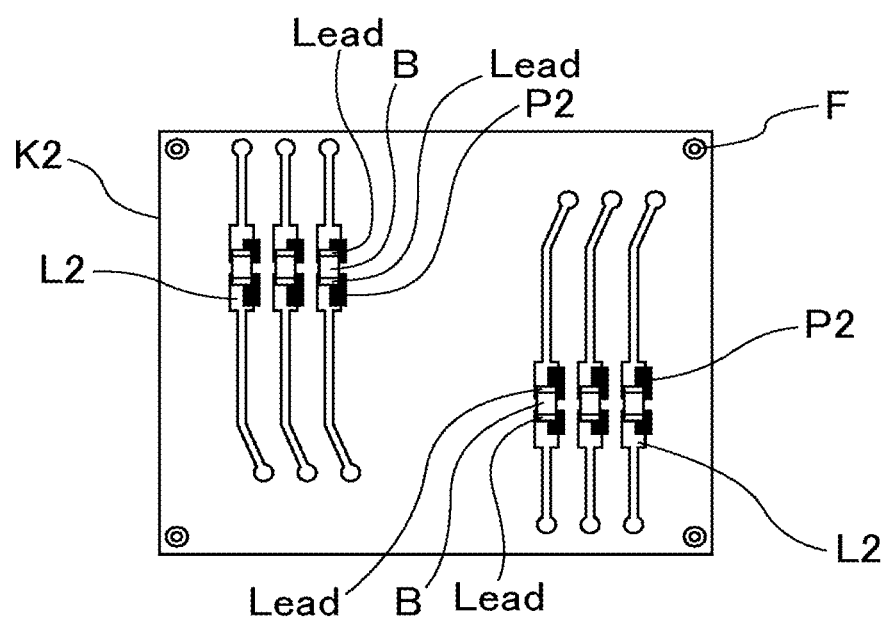
FIG. 12 is a plan view schematically illustrating a state in which components are mounted on a printed circuit board using conventional technology in which TOP mounting is not performed.

Next, schematic description will be given of the effects of the board production work method of the first embodiment in comparison to conventional technology in which TOP mounting is not performed. FIG. 10 is a plan view schematically illustrating a state in which components are mounted on solder paste P2 on printed circuit board K2 in component mounting process S3 of the first embodiment. FIG. 11 is a plan view schematically illustrating a state in which, after component mounting process S3 of FIG. 10, solder paste P2 on the printed circuit board is remelted in a reflow oven. FIG. 12 is a plan view schematically illustrating a state in which components are mounted on the printed circuit board K2 using conventional technology in which TOP mounting is not performed. Note that, in FIGS. 10 to 12, solder paste P2 and the remelted solder are illustrated in solid black for convenience.

As shown in FIGS. 10 and 12, printed circuit board K2 is rectangular, and a fiducial mark F is provided in the vicinity of each corner. A total of twelve lands L2 are formed in portions of the circuit pattern of printed circuit board K2. Solder paste P2 is printed on each of the lands L2, and a total of twelve leads, the leads at both ends of six components B, are mounted on the corresponding solder paste P2. The control computer holds the coordinate values of the mounting points which are set to the centers of the twelve lands L2 as the design information. Here, the printing of the paste-form solder P2 onto the lands L2 may be shifted. In the examples of FIGS. 10 and 12, the solder positions of solder paste P2 deviate rightward in the drawing due to parallel movement in relation to the corresponding twelve lands L2.

In the first embodiment, since the actual solder positions are detected, it is possible to obtain the deviation amounts of the solder positions in relation to lands L2. Furthermore, it is possible to correct the coordinate values of the mounting points by the deviation amounts. Therefore, as illustrated in FIG. 10, by performing TOP mounting, it is possible to mount the leads of the components B in the centers of the solder positions instead of the centers of lands L2. Therefore, a self alignment effect is obtained in the reflow oven. In other words, as illustrated in FIG. 11, the components B which are mounted to the centers of the solder positions are automatically subjected to positional correction to the vicinity of the centers of lands L2 as the remelted solder flows toward the centers of lands L2.

In contrast, with the conventional technology of FIG. 11, the leads of components B are mounted to the centers of lands L2 based on the coordinate values of the mounting points from the design information. However, if the actual mounting points are in the centers of lands L2, the mounting points deviate from the centers of the solder positions. Therefore, when the solder which is remelted in the reflow oven flows to the centers of lands L2, an adverse effect arises such as components B being pushed out from the centers of the lands L2 and falling over. In the first embodiment, these adverse effects do not arise.

Note that, in the first embodiment, multiple items of difference image data may be calculated by acquiring more than two items of original image data. For example, with multiple items of difference image data, it is possible to use a specific item of first difference image data ordinarily, use the second item of difference image data onward as spares, and only use the second item of difference image data onward when the solder positions could not be detected using the first difference image data. As another example, the multiple items of difference image data may be used ordinarily, and the detection reliability may be increased by comparing the solder positions detected with each.

A board production work method of the first embodiment includes a position detection process (solder position detection process S2) which detects an arrangement position (a solder position) of a detection target (solder paste P1 or P2) provided on a printed circuit board (printed circuit board K1 or K2), and a work executing process (component mounting process S3) which subjects the printed circuit board K1 or K2 to predetermined production work (mounting work of component B) based on the detected arrangement position, in which the position detection process includes image acquisition steps S21 and S22 of imaging printed circuit board K1 or K2 under multiple imaging conditions and acquiring multiple items of original image data Bd1 and Bd2 containing luminance values of each pixel arranged in two-dimensional coordinates, difference calculation step S23 of using two of the multiple items of original image data Bd1 and Bd2 as calculation targets, calculating differences between luminance values of pixels with same coordinate values, and acquiring difference image data Dd which is formed of luminance difference values of each of the pixels, and position determination step S24 of determining the arrangement position based on the difference image data Dd.

Accordingly, the differences between the luminance values of the multiple items of original image data Bd1 and Bd2 which are acquired by imaging printed circuit board K1 or K2 under multiple imaging conditions are calculated and used as the difference image data Dd. Here, luminance values of each of the pixels do not change uniformly when the imaging conditions are changed, in other words, the luminance difference (the difference in luminance values) changes depending on the object in the visual field of each pixel. Therefore, when comparing first original image data Bd1 and second original image data Bd2 which are acquired under corresponding imaging conditions, it is possible to set a set of two imaging conditions under which the change amount of the luminance differs greatly between the arrangement position (the solder position) and the other positions. Accordingly, even when another object having the same degree of luminance value as the detection target is hypothetically present in the other position and it is not possible to distinguish the detection target from the other object in the individual items of original image data Bd1 and Bd2, it is possible to precisely detect the arrangement position (the solder position) of the detection target (solder paste P1 or P2) on the printed circuit board based on the difference image data Dd. Thus, it is possible to perform TOP mounting based on the detected arrangement position (the solder position).

In the first embodiment, in the multiple imaging conditions of image acquisition steps S21 and S22, at least one of an exposure time of a camera (the imaging section 61) which images the printed circuit board, light source color conditions of a light source (the vertical emission light source 62 and the oblique emission light source 63) which irradiates the printed circuit board with a light beam during the imaging, and emission direction conditions of the light beam is changed.

Accordingly, since it is possible to freely select a set of two imaging conditions which is favorable in the detection of the arrangement position (the solder position) from among the combinations of various imaging conditions, it is easy to detect the arrangement position (the solder position) in the difference image data Dd, and the detection precision is also improved.

Furthermore, in the first embodiment, the position detection process is solder position detection process S2 which uses solder paste P which is printed on printed circuit board K1 or K2 as the detection target, and uses a solder position in which the solder paste P is present as the arrangement position, and the work executing process is a component mounting process S3 which mounts a component on the solder paste P on printed circuit board K1 or K2 based on the detected solder position.

Accordingly, it is possible to detect the solder position even if the simple, low cost, monochrome board camera 6 is used. Therefore, this is favorably applicable for use in performing TOP mounting using component mounting machine 1, and it is not necessary to greatly modify the device configuration of the component mounting machine 1.

Next, description will be given of a board production work method of the second embodiment with reference to the work process diagram of FIG. 13, focusing on the points which differ from the first embodiment. In the second embodiment, component mounting machine 1 used is the same as in the first embodiment. In comparison to the first embodiment, steps S25 to S29 are added within solder position detection process S2A in the board production work method of the second embodiment.

Figure 13:
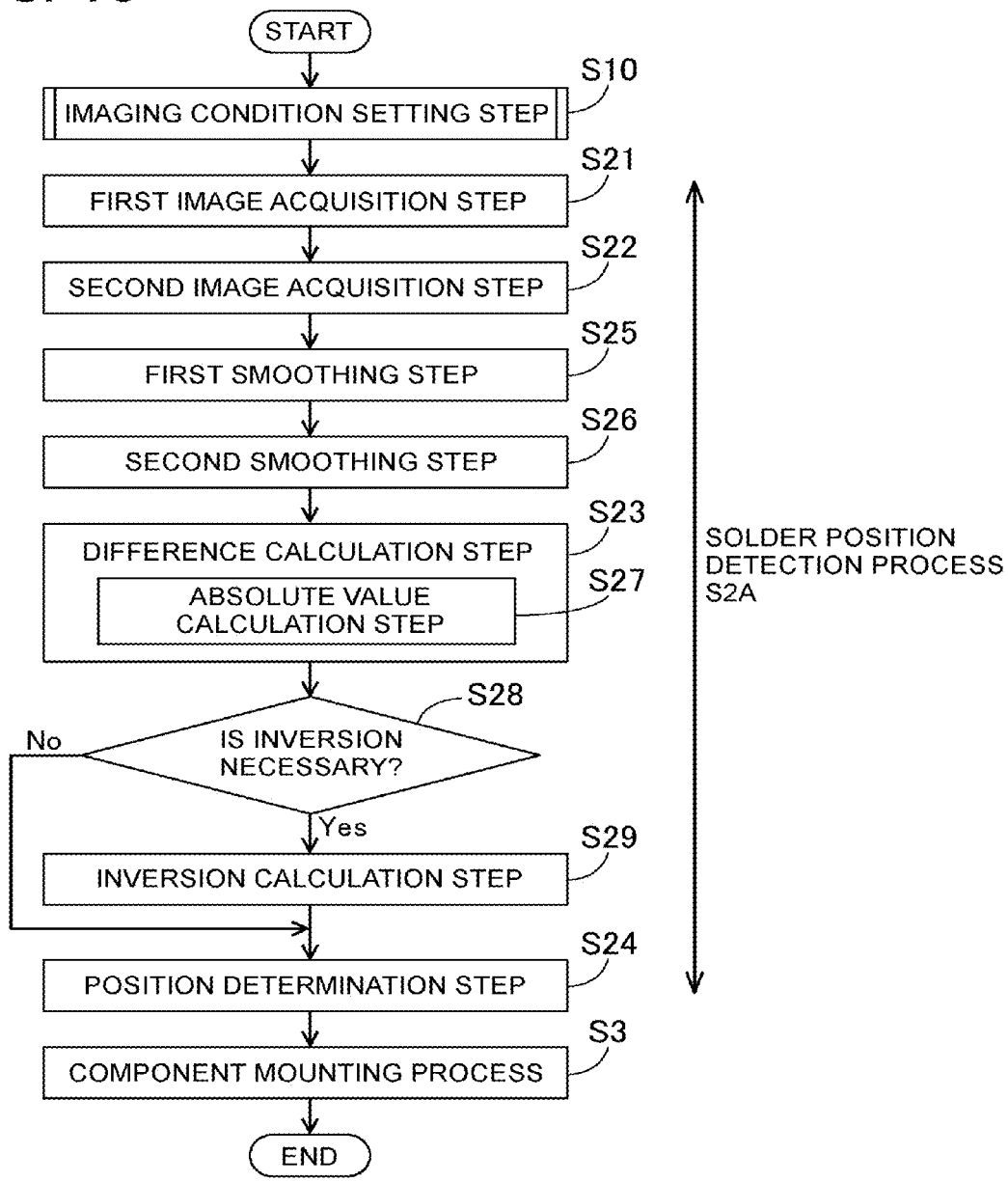
FIG. 13 is a work process diagram describing a board production work method of a second embodiment.

In imaging condition setting step S10 of the work process diagram of FIG. 13, the operator sets the first imaging conditions and the second imaging conditions when imaging printed circuit board K using board camera 6 in the control computer. Next, when the operator issues a command to perform solder position detection process S2A onward and component mounting process S3, subsequently, the control computer automatically performs each of the processes S2A (S21 to S29), and S3. In the first and second image acquisition steps S21 and S22 of solder position detection process S2A, the control computer controls board camera 6 to assume the first and second imaging conditions, causes board camera 6 to perform the imaging operation, and acquires first and second original image data Bd1 and Bd2.

Next, in the first and second smoothing steps S25 and S26, the control computer subjects the first and second original image data Bd1 and Bd2 to a smoothing correction process. In the smoothing correction process, it is possible to perform correction such that the luminance values of each of the pixels change smoothly according to the changes in the coordinate values of the first and second original image data Bd1 and Bd2. Accordingly, it is possible to obtain clear and stable original image data Bd1 and Bd2 by reducing the influence of the scattering of measurements.

An example of a specific method of the smoothing correction process is a moving average filter process or a Gaussian filter process in two-dimensional coordinates, but the method is not limited thereto. In the moving average filter process, an averaging region is set in the periphery of the calculation target pixel, an average value of the luminance values of the pixels in the averaging region is obtained and used as the post-correction luminance value of the calculation target pixel, and this process is performed on all of the pixels. In the Gaussian filter process, a weighted average value according to a Gaussian distribution (a normal distribution) is obtained as the average value of the luminance values of the pixels in the averaging region.

Next, in difference calculation step S23, the control computer uses first original image data Bd1 and second original image data Bd2 after the smoothing correction process as calculation targets, calculates the differences between the luminance values of the pixels of the same coordinate values, and acquires difference image data Dd which is formed of the luminance difference values of each of the pixels. Here, difference calculation step S23 contains an absolute value calculation step S27 which inverts the symbol when the luminance difference value of each pixel is a negative value to obtain a positive value. The reason that the luminance difference values are inverted is to not generate errors when displaying difference image data Dd, and to render case-by-case calculation processing unnecessary. Note that, since the first and second original image data Bs1 and Bd2 is subjected to the smoothing correction process in advance, the luminance difference values of the difference image data Dd also change smoothly according to the changing of the coordinate values.

Next, in step S28, the control computer determines the necessity of the inverting of difference image data Dd. In other words, the process proceeds to the inversion calculation step S29 only when the luminance difference values of the pixels in the arrangement position (the solder position) of difference image data Dd are smaller than the luminance difference values of the pixels in the other positions. In inversion calculation step S29, the control computer inverts the magnitude relationship of the luminance difference value of each of the pixels arranged in the two-dimensional coordinates of difference image data Dd. For example, the luminance difference values 0, 1, 2, . . . , 126, and 127 are switched with the luminance difference values 255, 254, 253, . . . , 129, and 128. Accordingly, the shading of the difference image data Dd is inverted, and black and while are switched with each other.

The inversion calculation step S29 is not performed in a first case in which the luminance difference values at the solder position are great and the luminance difference values at the other positions are great, and is performed in a second case in which the luminance difference values at the solder position are small and the luminance difference values at the other positions are great. Therefore, in both the first and second cases, it is standardized such that the luminance difference values of the solder position are greater than at the other positions. Accordingly, when difference image data Dd is displayed, the solder position appears brighter (whiter) than the other positions, and naked-eye inspection by the operator becomes simple. In both the first and second cases, it is possible to generalize and simplify the following calculation processes.

After the execution of inversion calculation step S29, the process proceeds to position determination step S24, and the flow also meets at position determination step S24 when the inversion is determined to be unnecessary in step S28. In position determination step S24, the control computer determines the solder position at which the solder paste P is present based on difference image data Dd. At this time, since the luminance difference value differs greatly between the solder position and the other positions in difference image data Dd, and the luminance difference values of difference image data Dd change smoothly according to the changing of the coordinate values, it is possible to easily determine the solder position. Next, the control computer corrects the coordinate values of the mounting point of the component at the start of component mounting process S3 and subsequently performs TOP mounting.

In the board production work method of the second embodiment, difference calculation step S23 includes absolute value calculation step S27 of inverting a symbol when the luminance difference values of each of the pixels is a negative value to obtain a positive value, and, in position determination step S24, the arrangement position (the solder position) and the positions other than the arrangement position are determined based on a change amount or a change rate by which the luminance difference value of each of the pixels changes according to the change in the coordinate values in difference image data Dd, or, based on a magnitude relationship between the luminance difference value and a predetermined threshold of each of the pixels of difference image data Dd.

Accordingly, since the symbol is inverted when the luminance difference value is a negative value to obtain a positive value, it is not necessary to perform the following calculation processes on a case-by-case basis. It is possible to reliably detect the arrangement position (the solder position) by focusing on the change amount or the change rate at which the luminance difference value changed according to the changing of the coordinate values indifference image data Dd, or, by comparing the luminance difference value to a predetermined threshold.

In the second embodiment, smoothing steps S25 and S26 of subjecting original image data Bd1 and Bd2 to a smoothing correction process such that luminance values of each of the pixels change smoothly corresponding to a change in the coordinate values are included after image acquisition steps S21 and S22.

Accordingly, since the original image data is subjected to the smoothing correction process, the luminance difference values of difference image data Dd also change smoothly according to the changing of the coordinate values. Therefore, it is possible to more reliably detect the arrangement position (the solder position) in difference image data Dd.

In the second embodiment, inversion calculation step S29 of inverting a magnitude relationship of luminance difference values of each pixel arranged in the two-dimensional coordinates only when a luminance difference value of a pixel in the arrangement position of difference image data Dd is smaller than a luminance difference value of a pixel in the position other than the arrangement position is included after difference calculation step S23.

Accordingly, if there is a difference in the luminance difference values between the solder position and the other positions of difference image data Dd, it is possible to display the luminance difference values of the solder position brightly (white) by rendering the luminance difference values of the solder position greater than those of the other positions, regardless of the original magnitude relationship. Therefore, naked-eye inspection of the difference image data by the operator becomes simple. Regardless of the original magnitude relationship, it is possible to generalize and simplify the following calculation processes.

Next, description will be given of a board production work method of the third embodiment with reference to the work process diagram of FIG. 14, focusing on the points which differ from the first and second embodiments. In the third embodiment, component mounting machine 1 used is the same as in the first and second embodiments. The board production work method of the third embodiment is provided with imaging condition determination process S1, solder position detection process S2B, and component mounting process S3B. Solder position detection process S2B and component mounting process S3B of the third embodiment are the same as in the second embodiment; however, the embodiment is not limited thereto, and different methods to in the second embodiment may be adopted. Note that, the third embodiment is also the embodiment of the board imaging conditions determination method of the present disclosure.

Imaging condition determination process S1 of the third embodiment is a process which determines the multiple imaging conditions of image acquisition steps S21 and S22 of solder position detection process S2B in advance. Imaging condition determination process S1 includes test image acquisition step S11, test difference calculation step S12, and test determination step S13.

Figure 14:
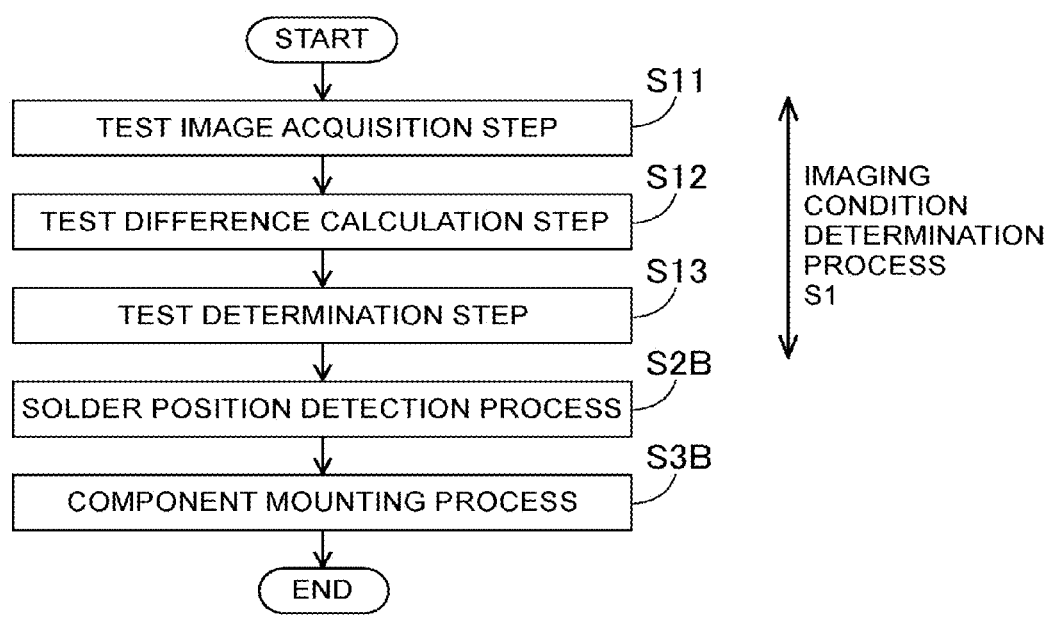
FIG. 14 is a work process diagram describing a board production work method of a third embodiment.

In test image acquisition step S11 of the work process diagram of FIG. 14, the control computer acquires various test image data containing luminance values of each pixel which is arranged in two-dimensional coordinates by imaging a sample printed circuit board under various imaging conditions. The sample printed circuit board is a printed circuit board on which the detection target is provided and for which the arrangement position is known, and, in the third embodiment, corresponds to a printed circuit board on which solder paste is printed and for which the solder position is known. Here, it is necessary to acquire the information of the known solder position from outside of the test image data. For example, the test image data is displayed to the operator, and by allowing the operator to specify the solder position using a user interface such as a mouse (a position pointer), it is possible to render the solder position known. Alternatively, the solder position may be detected using a different high definition camera from board camera 6 and the detected data may be transferred.

Figure 15:
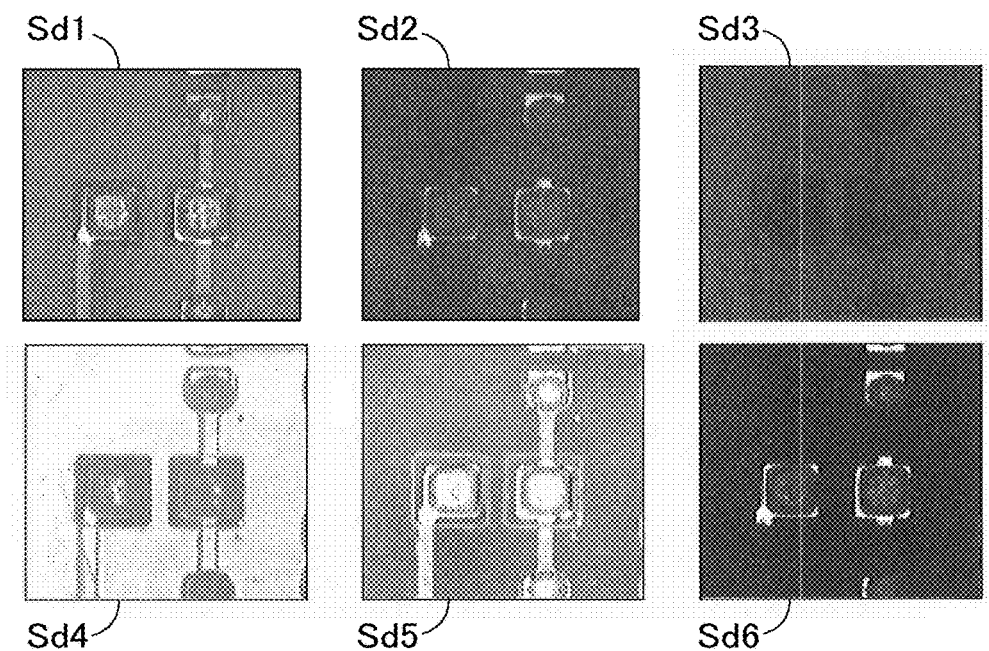
FIG. 15 is a diagram showing a portion for six items of various test image data which were acquired in a test image acquisition step in the third embodiment.

As the varied imaging conditions, for example, considering a case in which there are two light source color conditions, three emission direction conditions, and five exposure times, there are a possible total of 30 sets of imaging conditions. Of these imaging conditions, the control computer acquires the test image data for the imaging conditions other than those which are clearly disadvantageous. FIG. 15 is a diagram showing a portion for six items (test image data Sd1 to Sd6) of various test image data which are acquired in the test image acquisition step S11 in the third embodiment. In the six illustrated items of test image data Sd1 to Sd6, the luminance values of each of the pixels differ depending on the imaging conditions. Note that, each item of test image data Sd1 to Sd6 may be subjected to the smoothing correction process described in the second embodiment.

Figure 16:
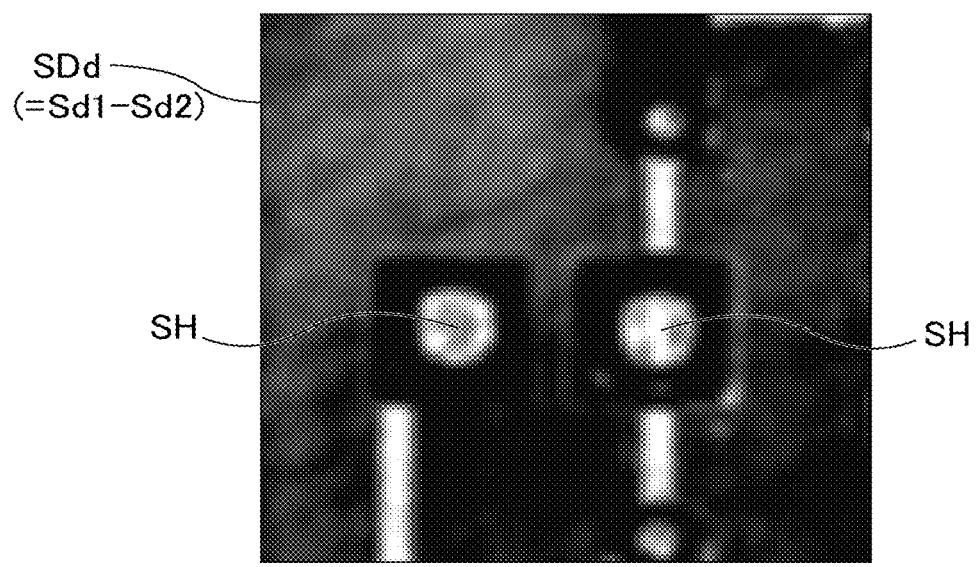
FIG. 16 is a diagram showing test difference image data which was acquired in a test difference calculation step in the third embodiment.

Next, in test difference calculation step S12, the control computer uses multiple combinations of two items of the various test image data as calculation targets, calculates the absolute values of the differences between the luminance values of the pixels of the same coordinate values in each combination, and acquires multiple items of test difference image data which is formed of the luminance difference values of each of the pixels. For example, when there are 30 items of test image data, there are 435 combinations of two of these, and this is the maximum number of items of test difference image data. FIG. 16 is a diagram showing test difference image data SDd which is acquired in test difference calculation step S12 in the third embodiment. Test difference image data SDd of FIG. 16 is obtained by using test image data Sd1 of the top-right of FIG. 15 and test image data Sd2 of the top-center as the calculation targets, and calculating the absolute values of the differences between the luminance values of the pixels of the same coordinate values.

Figure 17:
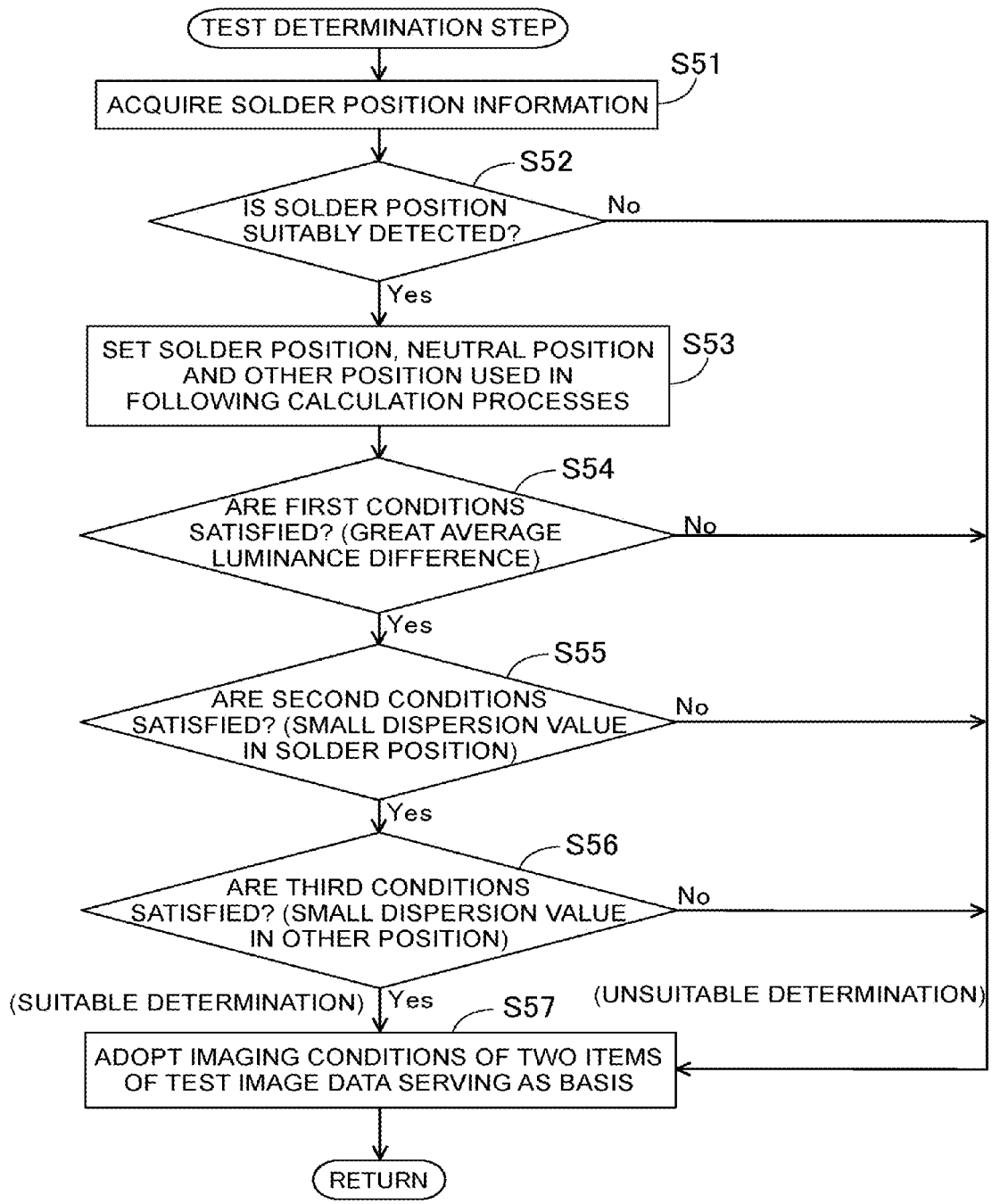
FIG. 17 is a process flowchart illustrating the execution content of a test determination step in relation to a single item of test difference image data in the third embodiment.

Next, in test determination step S13, the control computer determines the suitability of each of multiple items of test difference image data based on the known arrangement position, and determines a set of imaging conditions of the two items of test image data upon which the test difference image data which is determined to be suitable is based as the multiple imaging conditions of the image acquisition step. In other words, the control computer determines the suitability of whether it is possible to precisely detect the solder position for each of the maximum 435 items of test difference image data. For example, the control computer determines the suitability of whether it is possible to precisely detect two solder positions SH in test difference image data SDd which is shown in FIG. 16. FIG. 17 is a process flowchart illustrating the execution content of test determination step S13 in relation to a single item of test difference image data in the third embodiment.

In step S51 of the process flow of FIG. 17, the control computer acquires the known solder position described earlier. Next, in step S52, the control computer determines whether it is possible to suitably detect the solder position based on the test difference image data. Described in detail, the control computer determines the solder position by subjecting the test difference image data to a calculating process which corresponds to position determination step S24 described in the first embodiment, and determines whether the determined solder position substantially matches the known solder position. When there is no match and when the solder position could not be determined, the control computer determines that the corresponding test difference image data is unsuitable and ends the process flow.

When the solder position could be suitably detected in step S52, the process proceeds to step S53, and the control computer sets a solder position H, a neutral position N, and another position T which are used in the following calculation processes. The neutral position N is for reducing the influence of measurement error and scattering of the luminance values in the vicinity of the boundary between the solder position H and the other position T. The control computer sets the neutral position N of a predetermined width on both sides of the boundary line of the known solder position or the detected solder position. The control computer does not use the luminance difference values of the pixels in the neutral position N in the following steps S54 to S56, in other words, does not use the luminance difference values of the pixels in the neutral position N in the determination of the suitability.

Figure 18:
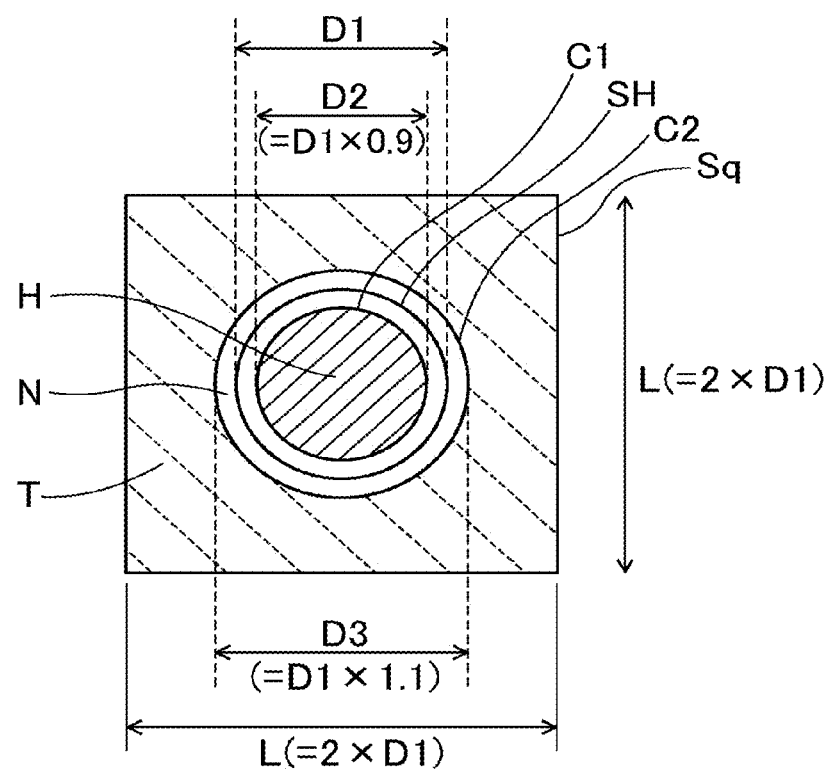
FIG. 18 is a diagram which describes, by example, a solder position, a neutral position, and another position in the test difference image data which is used by the test determination step of the third embodiment.

FIG. 18 is a diagram which explains, by example, solder position H, neutral position N, and other position T in the test difference image data which is used by test determination step S13 of the third embodiment. For convenience, in FIG. 18, solder position H is hatched with solid lines, and other position T is hatched with dashed lines. As shown in FIG. 16, when the known solder position or the solder position SH are substantially circular, a diameter D1 of the circle of the solder position SH is used as a reference. A region using circle C1 of diameter D2 reduced in size by 10% (=D1×0.9) as the outside boundary is used as solder position H which is used in the determination of suitability. A region using circle C2 of diameter D3 enlarged in size by 10% (=D1×1.1) as the inside boundary and using a square Sq having a side length of length L double the diameter D1 (=2×D1) is used as the other position T which is used in the determination of suitability. A ring-shaped region using circle C1 as the inside boundary and circle C2 as the outside boundary is used as neutral position N.

The setting method of the solder position H, the neutral position N, and the other position T which are used in the determination of the suitability is not limited to the one described above. For example, even if the known solder position or the detected solder position is non-circular, it is possible to set the neutral position N of a predetermined width on both sides of the boundary line. The inside boundary and the outside boundary of other position T may be a similar shape to the outside boundary of solder position H. Furthermore, the surface ratio of solder position H to other position T, that is the ratio of the numbers of pixels can also be set variably. For example, in a printed circuit board with an intricate circuit pattern, it is preferable not to excessively expand other position Tin order to reduce the influence of other lands and the like.

Next, in step S54, the control computer determines whether the first conditions, under which the average luminance difference which is represented by the deviation between the average value of the luminance difference values of the multiple pixels in solder position H and the average value of the luminance difference values of the multiple pixels in other position T is greater than or equal to a predetermined luminance difference, are satisfied. Next, in step S55, the control computer determines whether the second conditions, under which the dispersion value of the distribution at which the luminance difference values of the multiple pixels in solder position H are scattered is less than or equal to a predetermined dispersion value, are satisfied. Furthermore, in step S56, the control computer determines whether the third conditions, under which the dispersion value of the distribution at which the luminance difference values of the multiple pixels in other position T are scattered is less than or equal to a predetermined dispersion value, are satisfied.

Under the first conditions, it is possible to more reliably distinguish solder position H from other position T the greater the average luminance difference between solder position H and other position T, and when the average luminance difference is small it is difficult to perform the distinction. Under the second conditions and the third conditions, the smaller the dispersion value of the luminance difference values of solder position H and other position T, the clearer solder position H and other position T, and when the dispersion value is great, erroneous distinction occurs easily. In the third embodiment, the first to the third conditions are considered to be necessary conditions for precisely detecting the solder position. In other words, if any one of the first to third conditions is not satisfied, the control computer determines that the corresponding test difference image data is unsuitable and ends the process flow. When all of the first to third conditions are satisfied, the control computer determines that the corresponding test difference image data is suitable, and the process proceeds to step S57.

In step S57, the control computer adopts a set of imaging conditions of the two items of test image data upon which the test difference image data which is determined to be suitable is based. The control computer subjects all items of test difference image data to the process flow of FIG. 17 and subsequently returns to the solder position detection process S2B of FIG. 14. At this time, the adopted imaging conditions are not limited to one set, and there are cases in which multiple sets are adopted, and there are cases in which not even one set can be adopted. When the number of sets is too many or too few, the predetermined luminance difference of the first conditions and the predetermined dispersion values of the second and third conditions are amended, as necessary, and the process flow of FIG. 17 is performed again.

Subsequently, since solder position detection process S2B and component mounting process S3B of FIG. 14 are the same as in the first and second embodiments, description thereof will be omitted.

The board production work method of the third embodiment is provided with imaging condition determination process S1 which determines, in advance, the multiple imaging conditions of image acquisition steps S21 and S22 before position detection process S2B.

Accordingly, since it is possible to determine, in advance, the multiple suitable imaging conditions from among the various imaging conditions, the inefficient labor of stopping the production work of the printed circuit board and determining the imaging conditions through trial and error does not arise.

In the third embodiment, imaging condition determination process S1 includes test image acquisition step S11 of imaging a sample printed circuit board on which the detection target is provided (the solder paste is printed) and for which the arrangement position (the solder position) is known under various imaging conditions, and acquiring various test image data Sd1 to Sd6 containing a luminance value of each pixel arranged in two-dimensional coordinates, test difference calculation step S12 of using multiple combinations in which two items of the various test image data Sd1 to Sd6 are combined as calculation targets, calculating differences or absolute values of differences between luminance values of pixels having the same coordinate values in each of the combinations, and acquiring multiple items of test difference image data SDd formed of luminance difference values of each of the pixels, and test determination step S13 of determining suitability of each of the multiple items of test difference image data SDd based on the known arrangement position, and determining imaging conditions of two items of test image data upon which the test difference image data which is determined to be suitable is based as the multiple imaging conditions of image acquisition steps S21 and S22.

Accordingly, in imaging condition determination process S1, multiple suitable imaging conditions are determined by testing multiple image processes using the sample printed circuit board without relying on only experience or intuition. Therefore, in the position detection process S2B, it is possible to reliably and precisely detect the arrangement position (the solder position SH) of the detection target on the printed circuit board based on the difference image data.

In the third embodiment, in test determination step S13, for each of the multiple items of test difference image data SDd, suitability is determined based on at least one of a first condition in which an average luminance difference represented by a deviation between an average value of luminance difference values of multiple pixels in the known arrangement position (the solder position H) and an average value of luminance difference values of multiple pixels in other positions T than the known arrangement position is greater than or equal to a predetermined luminance difference, a second condition in which a dispersion value of a distribution at which luminance difference values of multiple pixels in the known arrangement position (solder position H) are scattered is less than or equal to a predetermined dispersion value, and a third condition in which a dispersion value of a distribution at which luminance difference values of multiple pixels in other positions T are scattered is less than or equal to a predetermined dispersion value.

Accordingly, since it is possible to reliably select favorable test difference image data by quantitatively and objectively evaluating the suitability of the multiple items of test difference image data SDd, it is possible to reliably determine multiple suitable imaging conditions.

In the third embodiment, in test determination step S13, neutral position N in which the luminance difference values of the pixels are not used in determining the suitability is provided between the arrangement position (the solder position H) and other positions T.

Accordingly, since it is possible to reduce the influence of measurement error and scattering of the luminance values in the vicinity of the boundary between the solder position H and the other position T, the evaluation precision of the multiple items of test difference image data is improved. Therefore, it is possible to more reliably select favorable test difference image data, and it is possible to determine multiple suitable imaging conditions.

In the third embodiment, there is provided a board imaging conditions determination method in imaging condition determination process S1, the method including imaging condition determination process S1 which determines, in advance, multiple imaging conditions under which to image a detection target (the printed solder paste) provided on a printed circuit board, a position detection process (solder position detection process S2B) which detects the arrangement position (the solder position) of the detection target based on multiple items of original image data which are acquired by imaging the printed circuit board under the multiple imaging conditions, and a work executing process (component mounting process S3B) which subjects the printed circuit board to predetermined production work based on the detected arrangement position, test image acquisition step S11 of imaging a sample printed circuit board on which the detection target is provided and for which the arrangement position is known under various imaging conditions, and acquiring various test image data Sd1 to Sd6 containing a luminance value of each pixel arranged in two-dimensional coordinates, test difference calculation step S12 of using multiple combinations in which two items of the various test image data Sd1 to Sd6 are combined as calculation targets, calculating differences or absolute values of differences between luminance values of pixels having same coordinate values in each of the combinations, and acquiring multiple items of test difference image data SDd formed of luminance difference values of each of the pixels, and test determination step S13 of determining suitability of each of the multiple items of test difference image data SDd based on the known arrangement position (solder position SH), and determining imaging conditions of two items of test image data upon which test difference image data SDd which is determined to be suitable is based as multiple imaging conditions of position detection process S2B.

Accordingly, for the multiple combinations in which two items of the various test image data Sd1 to Sd6 which are acquired by imaging the sample printed circuit board under various imaging conditions are combined, each item of the test difference image data SDd is acquired through calculation, the suitability is determined, and the multiple imaging conditions are determined from test difference image data SDd which is determined to be suitable. Therefore, since the suitable combinations are selected by testing the image processing on all conceivable combinations of imaging conditions without relying on only experience and intuition, it is possible to reliably determine multiple favorable imaging conditions.

In the board imaging conditions determination method also made in the third embodiment, in test determination step S13, for each of the multiple items of test difference image data SDd, suitability is determined based on at least one of a first condition in which an average luminance difference represented by a deviation between an average value of luminance difference values of multiple pixels in the known arrangement position (solder position H) and an average value of luminance difference values of multiple pixels in other positions T which are positions other than the known arrangement position is greater than or equal to a predetermined luminance difference, a second condition in which a dispersion value of a distribution at which luminance difference values of multiple pixels in the known arrangement position (solder position H) are scattered is less than or equal to a predetermined dispersion value, and a third condition in which a dispersion value of a distribution at which luminance difference values of multiple pixels in other positions T are scattered is less than or equal to a predetermined dispersion value.

Accordingly, since it is possible to reliably select favorable test difference image data by quantitatively and objectively evaluating the suitability of the multiple items of test difference image data SDd, it is possible to reliably determine multiple suitable imaging conditions.

Note that, each method of the first to third embodiments can be embodied as component mounting machine 1 corresponding to the board production work device of the present disclosure. The effects of component mounting machine 1 of the embodiment are the same as the effects of each method of the first to third embodiments, and description thereof will be omitted.

INDUSTRIAL APPLICABILITY

The board production work method of the present disclosure and the board imaging conditions determination method are not limited to the TOP mounting of the component mounting machine described in each of the embodiments, and can also be used in various board production work of other work execution devices. The detection target is not limited to the solder paste, and the detection target can be used in position detection of a mounted component, silk-screen printed symbols such as characters and bar-codes, various markers such as fiducial marks, and the like.

REFERENCE SIGNS LIST

1: component mounting machine, 2: board conveyance device, 3: component supply device, 4: component transfer device, 5: component camera, 6: board camera, 61: imaging section, 62: vertical emission light source, 63: oblique emission light source, K, K2: printed circuit board, P, P1, P2: paste-form solder, L1, L2: land, SH: solder position, H: solder position, T: other position, N: neutral position, Bd1: first original image data, Bd2:

second original image data, Dd: difference image data, Sd1 to Sd6: test image data, SDd: test difference image data

The invention claimed is:

1. A board production work method, comprising:
a position detection process of detecting an arrangement position of a detection target provided on a printed circuit board; and
a work executing process of subjecting the printed circuit board to predetermined production work based on the detected arrangement position,
wherein the position detection process includes
an image acquisition step of imaging the printed circuit board under multiple imaging conditions and acquiring multiple items of original image data containing luminance values of each pixel arranged in two-dimensional coordinates,
a difference calculation step of using two of the multiple items of original image data as calculation targets, calculating differences between luminance values of pixels with same coordinate values, and acquiring difference image data which is formed of luminance difference values of each of the pixels, and
a position determination step of determining the arrangement position based on the difference image data, and
wherein an inversion calculation step of inverting a magnitude relationship of luminance difference values of each pixel arranged in the two-dimensional coordinates only when a luminance difference value of a pixel in the arrangement position of the difference image data is smaller than a luminance difference value of a pixel in a position other than the arrangement position is included after the difference calculation step.

2. The board production work method according to claim 1,
wherein, of the multiple imaging conditions of the image acquisition step, at least one of an exposure time condition of a camera which images the printed circuit board, light source color conditions of a light source which irradiates the printed circuit board with a light beam during the imaging, and emission direction conditions of the light beam is changed.

3. The board production work method according to claim 1,
wherein the difference calculation step includes an absolute value calculation step of inverting a symbol when the luminance difference value of each of the pixels is a negative value to obtain a positive value, and
wherein, in the position determination step, the arrangement position and the positions other than the arrangement position are determined based on a change amount or a change rate by which the luminance difference value of each of the pixels changes according to the change in the coordinate values in the difference image data, or, based on a magnitude relationship between the luminance difference value of each of the pixels of the difference image data and a predetermined threshold.

4. The board production work method according to claim 1,
wherein a smoothing step of subjecting the original image data to a smoothing correction process such that luminance values of each of the pixels change smoothly corresponding to a change in the coordinate values is included after the image acquisition step.

5. The board production work method according to claim 1,
wherein an imaging condition determination process of determining the multiple imaging conditions of the image acquisition step in advance is provided before the position detection process.

6. The board production work method according to claim 1,
wherein the position detection process is a solder position detection process in which solder paste which is printed on the printed circuit board is the detection target, and in which a solder position at which the solder paste is present is the arrangement position, and
wherein the work executing process is a component mounting process which mounts a component on the solder paste on the printed circuit board based on the detected solder position.

7. A board production work method, comprising:
a position detection process of detecting an arrangement position of a detection target provided on a printed circuit board; and
a work executing process of subjecting the printed circuit board to predetermined production work based on the detected arrangement position,
wherein the position detection process includes
an image acquisition step of imaging the printed circuit board under multiple imaging conditions and acquiring multiple items of original image data containing luminance values of each pixel arranged in two-dimensional coordinates,
a difference calculation step of using two of the multiple items of original image data as calculation targets, calculating differences between luminance values of pixels with same coordinate values, and acquiring difference image data which is formed of luminance difference values of each of the pixels, and
a position determination step of determining the arrangement position based on the difference image data,
wherein the multiple imaging conditions includes a first imaging condition illuminated by a first light source emitting a first light color in a first direction and a second imaging condition illuminated by a second light source emitting a second light color in a second direction oblique to the first direction,
wherein an imaging condition determination process of determining the multiple imaging conditions of the image acquisition step in advance is provided before the position detection process,
wherein the imaging condition determination process includes
a test image acquisition step of imaging a sample printed circuit board on which the detection target is provided and for which the arrangement position is known under various imaging conditions, and acquiring various test image data containing a luminance value of each pixel arranged in two-dimensional coordinates,
a test difference calculation step of using multiple combinations in which two items of the various test image data are combined as calculation targets, calculating differences or absolute values of differences between luminance values of pixels having same coordinate values in each of the combinations, and acquiring multiple items of test difference image data formed of luminance difference values of each of the pixels, and a test determination step of determining suitability of each of the multiple items of test difference image data based on the known arrangement position, and determining imaging conditions of two items of test image data upon which the test difference image data which is determined to be suitable is based as the multiple imaging conditions of the image acquisition step.

8. The board production work method according to claim 7,
wherein, in the test determination step, for each of the multiple items of test difference image data, suitability is determined based on at least one of
a first condition in which an average luminance difference represented by a deviation between an average value of luminance difference values of multiple pixels in the known arrangement position and an average value of luminance difference values of multiple pixels in a position other than the known arrangement position is greater than or equal to a predetermined luminance difference,
a second condition in which a dispersion value of a distribution at which luminance difference values of multiple pixels in the known arrangement position are scattered is less than or equal to a predetermined dispersion value, and
a third condition in which a dispersion value of a distribution at which luminance difference values of multiple pixels in the other position are scattered is less than or equal to a predetermined dispersion value.

9. The board production work method according to claim 8,
wherein, in the test determination step, a neutral position in which the luminance difference values of the pixels are not used in determining the suitability is provided between the arrangement position and the other position.

10. A board imaging conditions determination method in an imaging condition determination process, the method comprising:
an imaging condition determination process which determines, in advance, multiple imaging conditions under which to image a detection target provided on a printed circuit board;
a position detection process which detects the arrangement position of the detection target based on multiple items of original image data which are acquired by imaging the printed circuit board under the multiple imaging conditions;
a work executing process which subjects the printed circuit board to predetermined production work based on the detected arrangement position;
a test image acquisition step of imaging a sample printed circuit board on which the detection target is provided and for which the arrangement position is known under various imaging conditions, and acquiring various test image data containing a luminance value of each pixel arranged in two-dimensional coordinates;
a test difference calculation step of using multiple combinations in which two items of the various test image data are combined as calculation targets, calculating differences or absolute values of differences between luminance values of pixels having the same coordinate values in each of the combinations, and acquiring multiple items of test difference image data formed of luminance difference values of each of the pixels; and
a test determination step of determining suitability of each of the multiple items of test difference image data based on the known arrangement position, and determining imaging conditions of two items of test image data upon which the test difference image data which is determined to be suitable is based as the multiple imaging conditions of the position detection process.

11. The board imaging conditions determination method according to claim 10,
wherein, in the test determination step, for each of the multiple items of test difference image data, suitability is determined based on at least one of
a condition in which an average luminance difference represented by a deviation between an average value of luminance difference values of multiple pixels in the known arrangement position and an average value of luminance difference values of multiple pixels in a position other than the known arrangement position is greater than or equal to a predetermined luminance difference,
a condition in which a dispersion value of a distribution at which luminance difference values of multiple pixels in the known arrangement position are scattered is less than or equal to a predetermined dispersion value, and
a condition in which a dispersion value of a distribution at which luminance difference values of multiple pixels in the other position are scattered is less than or equal to a predetermined dispersion value.

* * * * *